(12) United States Patent
Suzuki et al.

(10) Patent No.: US 10,803,972 B2
(45) Date of Patent: Oct. 13, 2020

(54) FLASH MEMORY MODULE, STORAGE SYSTEM, AND METHOD OF CONTROLLING FLASH MEMORY

(71) Applicant: Hitachi, Ltd., Chiyoda-ku, Tokyo (JP)

(72) Inventors: Akifumi Suzuki, Tokyo (JP); Junji Ogawa, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 9 days.

(21) Appl. No.: 16/327,272

(22) PCT Filed: Mar. 6, 2017

(86) PCT No.: PCT/JP2017/008852
§ 371 (c)(1),
(2) Date: Feb. 21, 2019

(87) PCT Pub. No.: WO2018/163258
PCT Pub. Date: Sep. 13, 2018

(65) Prior Publication Data
US 2019/0189239 A1 Jun. 20, 2019

(51) Int. Cl.
*H03M 13/00* (2006.01)
*G11C 29/52* (2006.01)
(Continued)

(52) U.S. Cl.
CPC ............ *G11C 29/52* (2013.01); *G06F 3/0619* (2013.01); *G06F 3/0658* (2013.01);
(Continued)

(58) Field of Classification Search
CPC ... G11C 29/52; G11C 29/50004; G11C 29/42; G11C 2029/0411; G11C 2029/5004;
(Continued)

(56) References Cited

U.S. PATENT DOCUMENTS 8,203,884 B2 * 6/2012 Kito .................. H01L 27/11565
257/316
8,443,263 B2 * 5/2013 Selinger .............. G06F 11/1068
714/768
(Continued)

FOREIGN PATENT DOCUMENTS

JP 2000-011670 A 1/2000
JP 2004-326867 A 11/2004
(Continued)

*Primary Examiner* — Albert Decady
*Assistant Examiner* — Enamul M Kabir
(74) *Attorney, Agent, or Firm* — Procopio, Cory, Hargreaves & Savitch LLP

(57) ABSTRACT

A flash memory module includes a flash memory and a controller. The controller acquires information indicating reliability of monitoring target data of the flash memory, specifies a first cell, which is a cell having a threshold voltage level lower than a threshold voltage level of a corresponding cell in expected value data obtained by correcting an error bit of the monitoring target data, among cells in which error bits have occurred of the monitoring target data when it is determined that the reliability indicated by the acquired information is lower than a predetermined condition, and transmits rewrite correction target cell data, which is data corresponding to data of the first cell in the expected value data, to the flash memory. The flash memory injects an electron into the first cell based on a threshold voltage indicated by the rewrite correction target cell data.

9 Claims, 11 Drawing Sheets

(51) Int. Cl.
*G06F 3/06* (2006.01)
*G11C 29/42* (2006.01)
*G06F 11/30* (2006.01)
*G06F 11/10* (2006.01)
*G11C 29/50* (2006.01)
*G11C 29/04* (2006.01)

(52) U.S. Cl.
CPC ........ *G06F 3/0679* (2013.01); *G06F 11/1048* (2013.01); *G06F 11/1068* (2013.01); *G06F 11/3058* (2013.01); *G11C 29/42* (2013.01); *G11C 29/50004* (2013.01); *G06F 3/0689* (2013.01); *G06F 11/1076* (2013.01); *G11C 2029/0411* (2013.01); *G11C 2029/5004* (2013.01)

(58) Field of Classification Search
CPC ............. G06F 11/1076; G06F 11/1048; G06F 11/3058; G06F 3/0679; G06F 3/0619; G06F 3/0658; G06F 3/0689; G06F 11/1068
USPC .......................................................... 714/764
See application file for complete search history.

(56) References Cited

U.S. PATENT DOCUMENTS

| | | |
|---|---|---|
| 2006/0268608 A1 | 11/2006 | Noguchi et al. |
| 2008/0288814 A1 | 11/2008 | Kitahara |
| 2011/0066899 A1 | 3/2011 | Kang et al. |
| 2013/0148435 A1* | 6/2013 | Matsunaga ........ G11C 16/3404 365/185.23 |
| 2013/0238836 A1* | 9/2013 | Suzuki ............... G11C 16/3495 711/103 |
| 2013/0336060 A1* | 12/2013 | Arakawa ................ G11C 16/06 365/185.09 |
| 2014/0281769 A1* | 9/2014 | Ohshima ................ G11C 29/42 714/721 |
| 2015/0234706 A1* | 8/2015 | Alrod .................... G06F 11/076 714/704 |
| 2016/0188231 A1* | 6/2016 | Mittelholzer ....... G06F 11/1012 714/704 |
| 2016/0350179 A1* | 12/2016 | Lin ................... H03M 13/2909 |

FOREIGN PATENT DOCUMENTS

| | | | |
|---|---|---|---|
| JP | 2008-287404 A | 11/2008 | |
| JP | 2013-200919 A | 10/2013 | |
| KR | 20130134186 A | * 12/2013 | ............. G11C 16/10 |

* cited by examiner

FLASH MEMORY MODULE, STORAGE SYSTEM, AND METHOD OF CONTROLLING FLASH MEMORY

CROSS-REFERENCE TO RELATED APPLICATIONS

This application is a U.S. National Stage entry of PCT Application No: PCT/JP2017/008852 filed Mar. 6, 2017, the contents of which are incorporated herein by reference.

TECHNICAL FIELD

The present invention relates to a flash memory module, a storage system, and a method of controlling a flash memory module.

BACKGROUND ART

A storage module on which a non-volatile memory has been mounted (hereinafter also referred to as a non-volatile memory storage module), such as a solid-state drive (hereinafter also referred to as the SSD) to which a NAND flash memory (hereinafter also referred to as the FM) has been mounted enables write and read of data at a higher speed than a hard disk drive (hereinafter also referred to as the HDD) which has been conventionally used as a long-term storage medium for an enterprise system or the like. In addition, a bit cost of the FM has been decreasing recently as the FM becomes miniaturized and multi-valued. As a result, a case where the non-volatile memory storage module is used instead of the HDD of the enterprise system or the like has increased with the intention of improving the performance of the enterprise system or the like The FM has a cell storing electrons, and holds a value by associating the number of the electrons injected in the cell with a bit value of data. If the number of the electrons injected into the cell changes with a lapse of time, there is a possibility that the associated bit value may change, which causes an error bit. Recently, in the FM that has been miniaturized and multi-valued, the error bit is likely to increase since the bit value changes even with slight movement of electrons so that a period during which data with maintained reliability can be held is short.

An example of the background art of the present technical field is US 2011/0066899 A (PTL 1). In a technique described in PTL 1, data held by a FM is periodically read, and a "refresh process" of recording data to the FM again after correcting a generated error bit, thereby maintaining reliability of the data.

CITATION LIST

Patent Literature

PTL 1: US 2011/0066899 A

SUMMARY OF INVENTION

Technical Problem

In the refresh process, a FM controller assigns an error correction code (ECC) to data and stores the resultant in the FM. Further, when finding a storage area whose error bits have increased, the FM controller reads data of the storage area and corrects the error bits using the ECC, and writes the corrected data to another storage area. Further, the controller erases data in the original storage area. Incidentally, the storage area after being subjected to erasure is reused as a storage area for another data.

In addition, the FM deteriorates when data stored in the FM is erased. Therefore, the FM deteriorates when the refresh process is executed. For example, when the refresh process is executed every month for data held in the FM for 10 years, the erase process is executed 10×12=120 times. FMs that have been miniaturized and multi-valued include one that can only allow about 50 times of erasures per storage area. When many refresh processes are performed on such a FM, the life of the FM expires in a short time. Therefore, an object of one aspect of the present invention is to maintain reliability of data held in a flash memory while achieving an increase in life of a flash memory.

Solution to Problem

In order to solve the above problem, one aspect of the present invention adopts the following configuration. A flash memory module including: a flash memory; and a controller which controls read and write of data from and to the flash memory, wherein the controller acquires information indicating reliability of monitoring target data in a monitoring target area of the flash memory, specifies a first cell, which is a cell having a threshold voltage level lower than a threshold voltage level of a corresponding cell in expected value data obtained by correcting an error bit of the monitoring target data, among cells in which error bits have occurred of the monitoring target data when it is determined that the reliability indicated by the acquired information is lower than a predetermined condition, and transmits rewrite correction target cell data, which is data corresponding to data of the first cell in the expected value data, to the flash memory, and wherein the flash memory injects an electron into the first cell based on a threshold voltage indicated by the rewrite correction target cell data.

Advantageous Effects of Invention

According to one embodiment of the present invention, the reliability of data held in the flash memory can be maintained while achieving the increase in life of the flash memory.

Other objects, configurations, and effects which have not been described above become apparent from embodiments to be described hereinafter.

DESCRIPTION OF EMBODIMENTS

Figure 1:
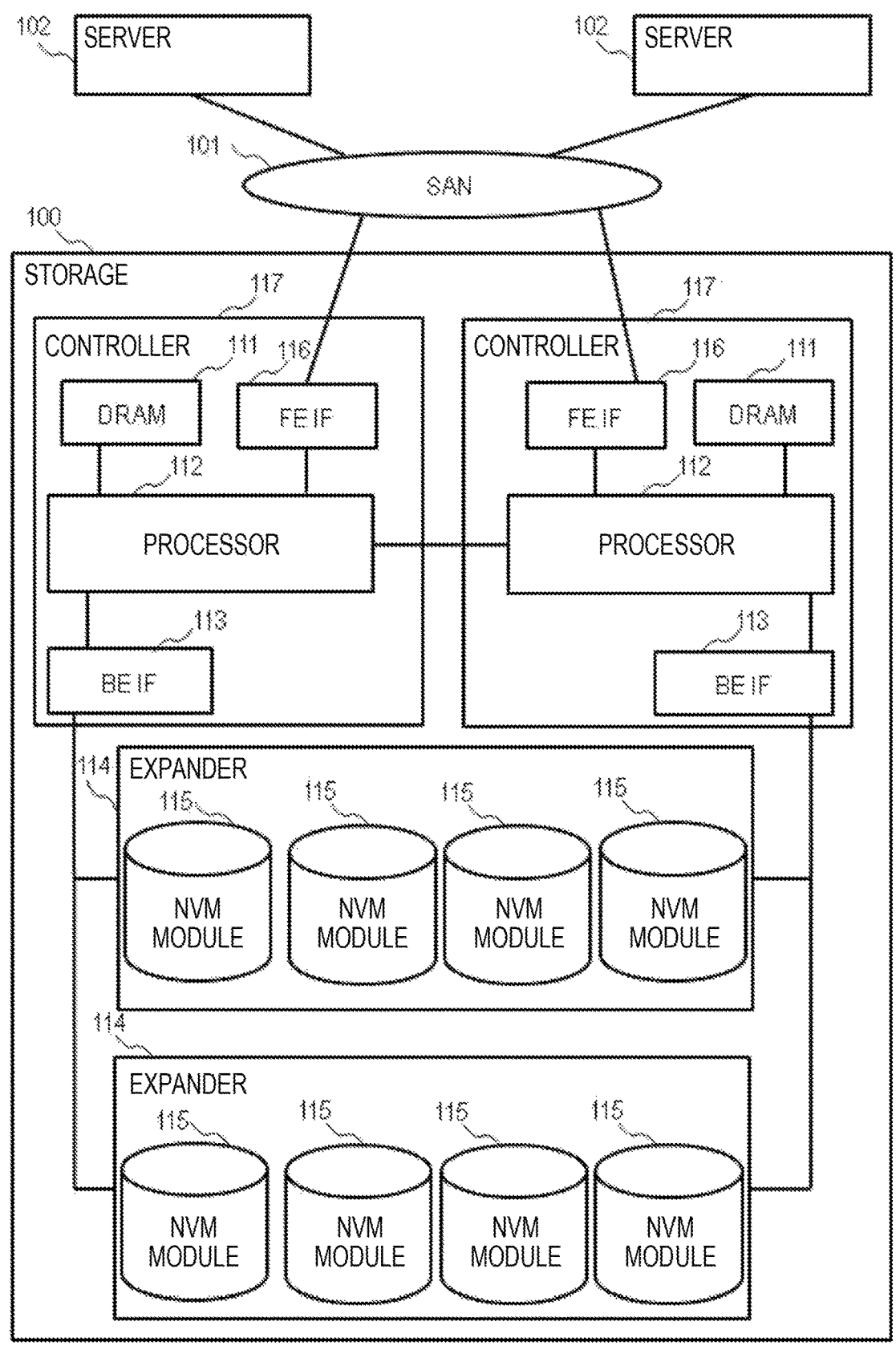
FIG. 1 is a block diagram illustrating a first configuration example of a storage system according to a first embodiment.

Hereinafter, embodiments of the present invention will be described with reference to the attached drawings. It should be noted that the embodiments are merely examples for realizing the present invention and do not limit a technical scope of the present invention. In the respective drawings, the same reference numerals are assigned to the common configurations.

First Embodiment (1-1) System Configuration

First, a system configuration example to which a non-volatile memory (NVM) module according to the present embodiment is applied will be described with reference to FIGS. 1 and 2. FIG. 1 is a block diagram illustrating a first configuration example of a storage system. The storage system includes, for example, a storage 100 and one or more servers 102. The storage 100 is connected to the server 102 via, for example, a storage area network (SAN) 101. Incidentally, the storage system does not necessarily include the SAN 101, and a connection form between the server 102 and the storage 100 in the storage system may be direct attached storage (DAS).

In response to a request from the server 102, the storage 100 executes write of data to a storage medium inside the storage 100 and read of data from the storage medium inside the storage. The storage 100 includes one or more controllers 117 and one or more expanders 114. The expander 114 includes a plurality of NVM modules 115.

The controller 117 includes, for example, a processor 112, a DRAM 111, a front-end interface 116, and a back-end interface 113. Incidentally, when a plurality of the controllers 117 are mounted on the storage 100 in order to ensure redundancy and failure occurs in a certain controller 117, it is desirable to design the storage 100 such that processing can be continued by the other controller 117. In the example of FIG. 1, the storage 100 includes the two controllers 117.

The processor 112 controls the storage 100 and is connected to the front-end interface 116, the DRAM 111, and the back-end interface 113. The processor 112 executes a program stored in the DRAM 111. Specifically, for example, the processor 112 executes a control program of the storage 100 and controls transfer of various types of data in the storage 100.

The front-end interface 116 is an interface configured to connect the storage 100 and the SAN 101. The front-end interface 116 transfers a request and data via the SAN 101 according to a protocol such as Ethernet and Fibre Channel (FC).

For example, the DRAM 111 stores a storage program executed by the processor 112 and temporarily stores data. The DRAM 111 temporarily stores data received from a host device as a write cache. At this time, the storage 100 secures the redundancy by copying write data received from the host device to the DRAM 111 of the other controller 117.

The back-end interface 113 is an interface configured for connection with the NVM module 115 which is a storage medium. The front-end interface 116 performs notification of various requests and data transfer according to a protocol such as Serial Attached SCSI (SAS) and FC, for example. The expander 114 is connected to the back-end interface 113.

The NVM module 115 has a FM (NAND flash memory) mounted therein, and is the storage medium which writes data into the FM in response to a request from the controller 117 of the storage 100 and reads data from the FM. That is, the NVM module 115 according to the present embodiment is a flash memory module. It is desirable that the storage 100 include a plurality of the NVM modules 115 and redundantly write data over the plurality of NVM modules 115. Since the storage 100 redundantly writes the data, it is possible to cope with a loss of data when the NVM module 115 suddenly fails.

An example of the data redundancy technique is a redundant array inexpensive disk (RAID). In the RAID, for example, the four NVM modules 115 are handled as one group, and the controller 117 writes write data received from the server 102 to be divided into the three NVM modules 115. In addition, at this time, the controller 117 performs an XOR operation on three data to be divided and written into the three NVM modules 115 to generate parity data. Further, the controller 117 writes the parity data to the fourth NVM module 115. With these processes, even if one of the four NVM modules 115 fails, it is possible to restore data recorded in the failed NVM module 115 from the data recorded in the other three NVM modules 115.

The system to which the NVM module 115 of the present embodiment is applied is not limited to the storage system illustrated in FIG. 1, and the NVM module 115 can be also applied to other systems which store data in the NVM module 115 to be saved for a long time. An example of the other systems is illustrated in FIG. 2.

Figure 2:
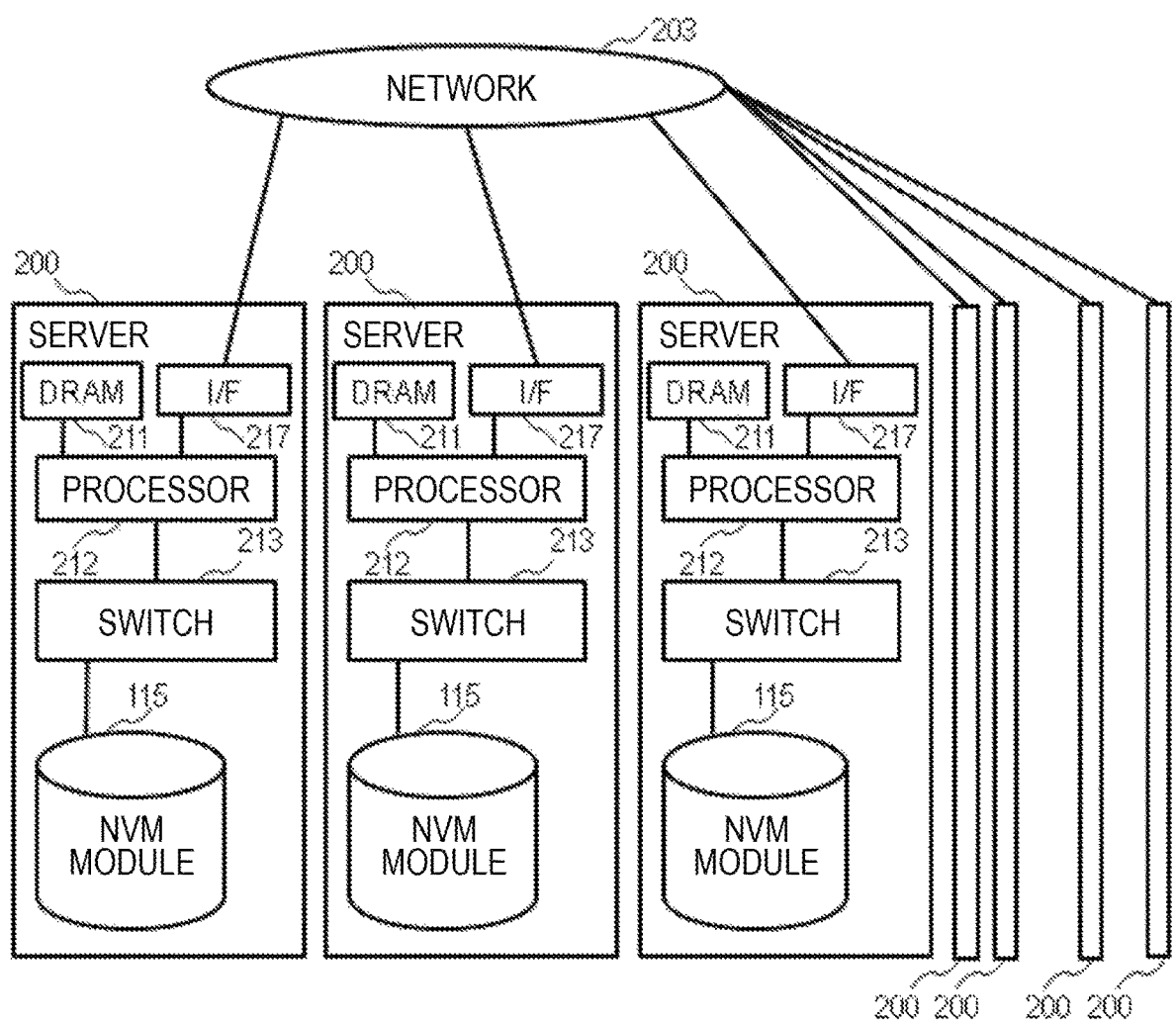
FIG. 2 is a block diagram illustrating a second configuration example of the storage system according to the first embodiment.

FIG. 2 is a block diagram illustrating a second configuration example of the storage system. A server 200 is, for example, a computer including a DRAM 211 which is a primary storage device, a processor 212 which executes various processes according to software, a switch 213 which connects various peripheral devices, the NVM module 115 which is a secondary storage device, and a network interface 217 to be connected to another server 200. Incidentally, the processor 212 and the NVM module 115 are connected via the switch 213 in the example of FIG. 2, but the processor 212 may be directly connected to the NVM module 115, for example.

The DRAM 211 is connected to the processor 212 by, for example, a connection method that can be accessed in a short time, and stores a program to be processed by the processor 212 and processing target data.

The processor 212 operates according to a program stored in the DRAM 211, for example, and processes target data. The processor 212 has, for example, a plurality of processor cores therein, and the processor cores process the program independently or in cooperation with each other. In addition, the processor 212 has, for example, a DRAM controller therein, and acquires data from the DRAM 211 and stores data in the DRAM 211 in response to a request from the processor 212.

In addition, the processor 212 has, for example, an external IO interface and is connected to the switch 213. In addition, the processor 212 can notify the NVM module 115, which is the secondary storage device, of an instruction via the switch 213. The processor 212 performs various processes. Incidentally, the network interface 217 is directly connected to the processor 212 in the example of FIG. 2, but may be connected to the processor 212 via the switch 213, for example.

For example, the processor 212 executes a hypervisor generating a virtual machine, and various applications operate on the virtual machine. When such applications permanently write data, an instruction is virtually made with respect to the virtual machine having a storage function. At this time, the processor 212, which processes the virtual machine having the storage function, writes the data stored in the DRAM 211 to the NVM module 115 according to a management method of the virtual machine having the storage function.

The switch 213 relays a high-speed external IO bus. The switch 213 transfers, for example, a packet of a connection standard such as PCI-Express or Infiniband by a routing method defined in the packet. The switch 213 communicates information among the processor 212 and various devices.

Incidentally, the single NVM module 115 is connected to the switch 213 in the example of FIG. 2, but the two or more NVM modules 115 may be connected to the switch 213, for example, and the number of NVM modules 115 connected to the switch 213 in each of the servers 200 may be different. For example, the single server 200 is connected to one NVM module 115 via the switch 213, and the two NVM modules 115 may be connected to the other server 200 via the switch 213.

The NVM module 115 is the secondary storage device that stores analysis target data and the like. In the present embodiment, the NVM module 115 acquires write target data from the DRAM 111 based on write information given in notification from the processor 212.

The network interface 217 is an interface configured for connection with a network 203 connecting between the servers 200. Although the server 200 communicates with the other server 200 using the network 203 in the example of FIG. 2, the server 200 may communicate with the other server 200 via Infiniband or the like, for example.

(1-2) Configuration of NVM Module

Figure 3:
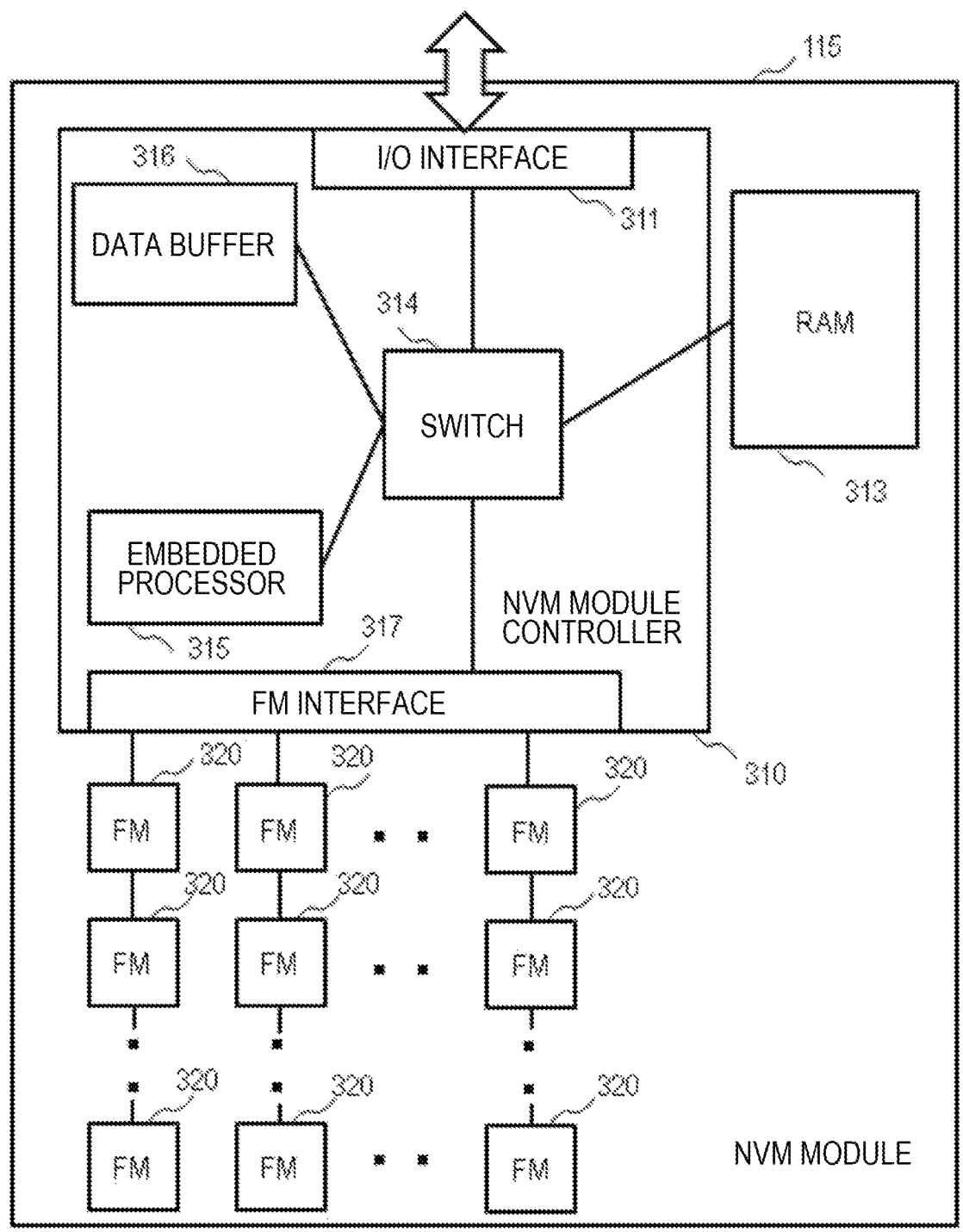
FIG. 3 is a block diagram illustrating an internal configuration example of an NVM module according to the first embodiment.

FIG. 3 is a block diagram illustrating an internal configuration example of the NVM module 115. The NVM module 115 includes, for example, an NVM module controller 310, a RAM 313, and a plurality of (for example, 32) FMs 320. Incidentally, the RAM 313 may be included in the NVM module controller 310.

The NVM module controller 310 controls read of data from the FM 320 and write of data to the FM 320, and includes, for example, an embedded processor 315, a data buffer 316, an I/O interface 311, a FM interface 317, and a switch 314 mutually performing data transfer.

The switch 314 connects the RAM 313 and the embedded processor 315, the data buffer 316, the I/O interface 311, and the FM interface 317 in the NVM module controller 310, and routes and transfers data between the respective parts in accordance with an address or ID. Incidentally, each hardware and hardware implementation logic are connected in a star shape to the single switch 314 in the example of FIG. 3, but the NVM module 115 may have a plurality of the switches 314, for example. Specifically, it is sufficient for each hardware and hardware implementation logic to be connected so as to be communicable via the switches 314.

The I/O interface 311 is connected to the host device. The I/O interface 311 is connected to each portion of the NVM module controller 310 via the switch 314. The I/O interface 311 receives various commands from the host device (for example, the controller 117 in FIG. 1 and the processor 212 in FIG. 2), and performs write to the RAM 313. In addition, when receiving a command from the host device, the I/O interface 311 interrupts the embedded processor 315 inside the NVM module controller 310 or records data notifying that the command has been received in a storage area on the RAM 313 which is being polled by the embedded processor 315.

The embedded processor 315 is connected to each part of the NVM module controller 310 via the switch 314, and controls the entire NVM module controller 310 based on the program and management information recorded in the RAM 313. In addition, the embedded processor 315 monitors the entire NVM module controller 310 by periodic information acquisition and an interrupt reception functions. The data buffer 316 stores temporary data in the course of data transfer processing in the NVM module controller 310.

The FM interface 317 is connected to the FM via, for example, a plurality of (for example, 16) buses. For example, a plurality of (for example, four) FMs are connected to each bus. The FM interface 317 independently controls the plurality of FMs connected to the same bus, for example, using a chip enable (CE) signal.

The FM interface 317 operates in response to a read/write request given in instruction from the embedded processor 315. The FM interface 317 reads the stored data from the FM 320 and transfers the read data to the data buffer 316 when receiving a read request, and calls data that needs to be stored from the data buffer 316 and transfers the called data to the FM 320 when receiving a write request.

In addition, the FM interface 317 has an ECC generation circuit, a data loss detection circuit using the ECC, and an ECC correction circuit, and writes data with the ECC at the time of writing the data. In addition, at the time of data call, the FM interface 317 inspects called data from the FM by the data loss detection circuit using the ECC at the time of calling the data, and performs data correction by the ECC correction circuit when detecting a data loss.

The switch 314, the I/O interface 311, the embedded processor 315, the data buffer 316, and the FM interface 317 may be configured inside one semiconductor element as an application specific integrated circuit (ASIC) and a field programmable gate array (FPGA), or may be configured by connecting a plurality of individual dedicated integrated circuits (ICs) to each other.

For example, the RAM 313 stores a transfer list including management information of the FM 320 to be used in the NVM module 115 and transfer control information used by each direct memory access (DMA) of the I/O interface 311 and the FM interface 317. A volatile memory such as a DRAM is an example of the RAM 313. Incidentally, the RAM 313 may have a function as a data buffer, and specifically, may store a part or whole of data instead of the data buffer 316. Incidentally, the NVM module controller 310 may be incorporated in each of the FMs 320.

(1-3) Internal Structure of FM

Figure 4:
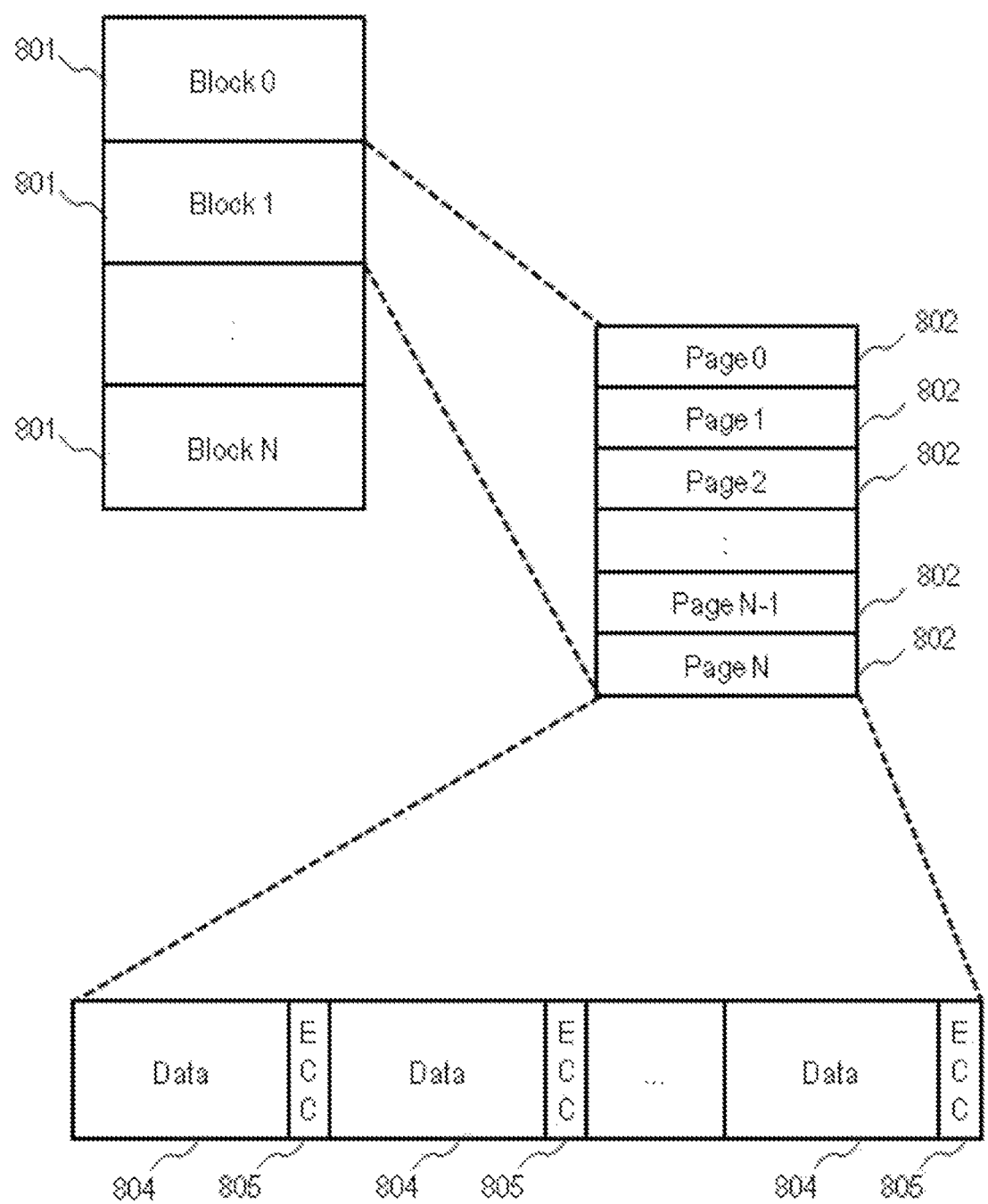
FIG. 4 is an explanatory diagram illustrating an example of an internal structure of a FM according to the first embodiment.

FIG. 4 is an explanatory diagram illustrating an example of an internal structure of the FM 320. A storage area of the FM 320 is divided into blocks 801 which are minimum erase units, and each of the blocks 801 is further divided into pages 802 which are minimum write units. Each of the pages 802 is constituted by 8 KB pieces or 16 KB pieces of cell groups in which write and read are performed in the same manner. In addition, the page stores a plurality of sets of data 804 and an ECC 805. The data 804 is a data body received by the NVM module 115 from the host device. The NVM module controller 310 calculates the ECC 805 and writes the calculated ECC 805 in the FM 320 such that an error bit occurring in the data body can be corrected. Hereinafter, the set of data 804 and ECC 805 is also referred to as an error correction code code word (ECC CW).

The FM 320 of a multi level cell (MLC) type, a triple level cell (TLC) type, a quad level cell (QLC) type, and the like records bit values of the plurality of pages 802 in one cell. Thus, the respective pages 802 constituting a block share the cell group with the other page 802. In the present embodiment, an example in which the FM is the MLC type will be described. In the FM of the MLC type, the two pages 802 share the cell group. In the example of FIG. 4, each of a set consisting of Page 0 and Page 1, . . . , and a set of Page N−1 and Page N is a set of the pages 802 sharing the cell group. Hereinafter, a set of pages sharing a cell group is also referred to as a paired page.

In the present embodiment, the FM 320 injects electrons into a cell whose threshold voltage has decreased again. At this time, it is difficult for the FM 320 to obtain a target threshold voltage to determine necessity of electron injection only from data of a single page, and can confirm the target threshold voltage of the cell using data of all paired pages sharing the cell. Thus, in the present embodiment, the NVM module controller 310 acquires the entire data of the paired pages during a rewrite process, and transfers the data obtained by correcting the error bit of the data acquired by the ECC 805 to the FM. Subsequently, the FM 320 calculates the target threshold voltage using the entire data of the paired pages and executes the rewrite process. Details of the rewrite process will be described later.

(1-4) Overview of Error Bit Occurrence in FM

The NVM module 115 of the present embodiment reduces the error bits occurring in the FM 320 to improve the reliability of the data held by the FM 320. First, an overview of error bit occurrence in the FM 320 will be described with reference to FIG. 5.

Figure 5:
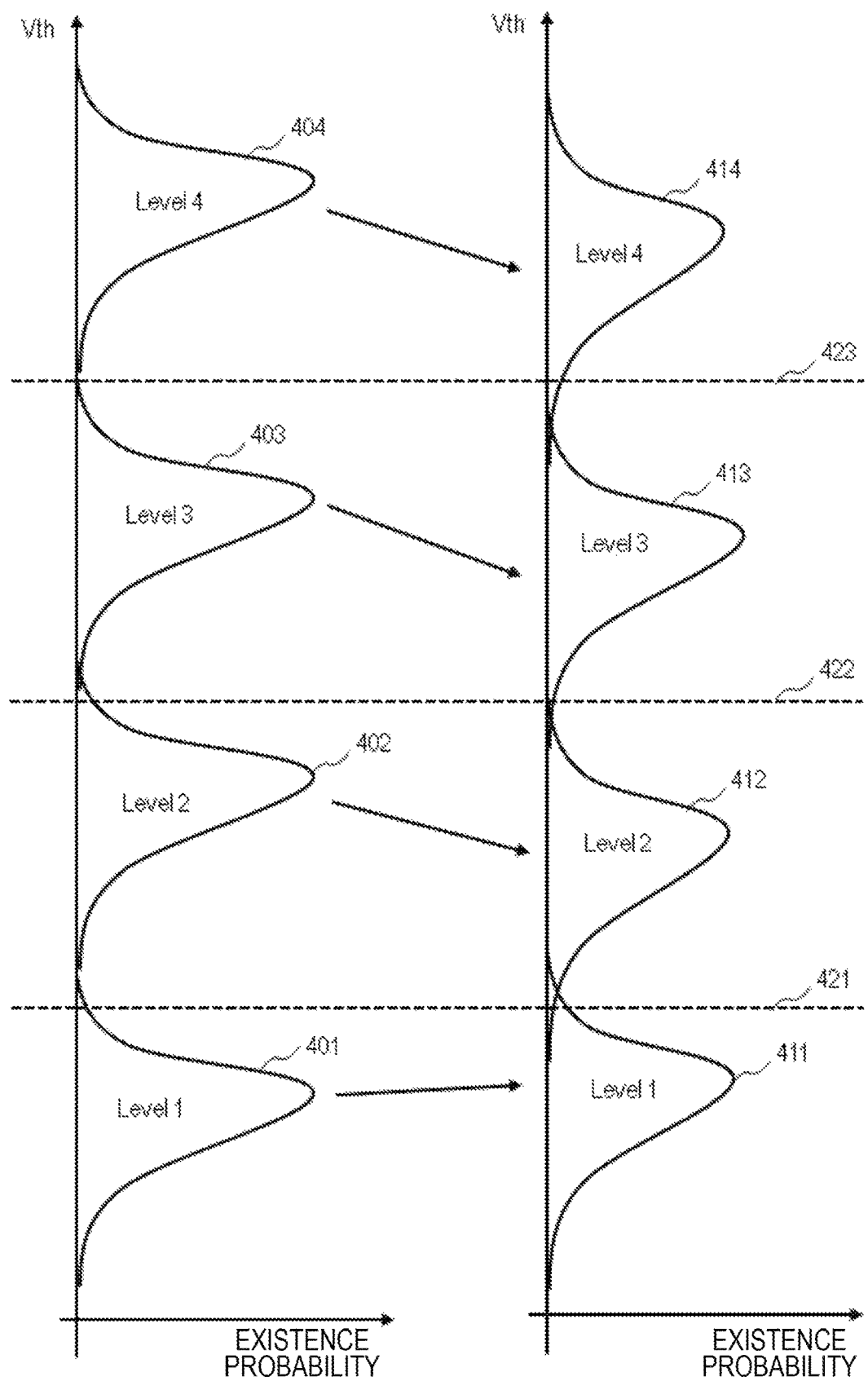
FIG. 5 is a graph illustrating an example of a distribution of a threshold voltage of an MLC-type FM according to the first embodiment.

FIG. 5 is a graph illustrating an example of a distribution of a threshold voltage of the MLC-type FM 320 storing a 2-bit value in one cell. Since the MLC-type FM 320 stores the 2-bit value in one cell, cell threshold voltages are classified into four (Levels 1 to 4), and a 2-bit value is associated with the threshold voltage of each level (for example, Level 1=11 b, Level 2=01 b, Level 3=00 b, and Level 4=10 b).

The graph on the left side of FIG. 5 illustrates a distribution of existence probability of the threshold voltage of the cell immediately after data write. At the time of writing data, the FM 320 injects electrons into a cell such that a threshold voltage of the cell becomes a value corresponding to a designated bit value, but the injection of electrons into the cell is unstable. Therefore, even if the FM 320 injects electrons into a plurality of cell groups so as to have the same threshold voltage, the threshold voltages of the plurality of cell groups vary like each of threshold voltage distributions 401 to 404 illustrated in the graph on the left side of FIG. 5.

When a cell threshold voltage is smaller than a read voltage 421, it is determined that the cell threshold voltage is Level 1. When a cell threshold voltage is equal to or higher than the read voltage 421 and lower than a read voltage 422, it is determined that the cell threshold voltage is Level 2. When a cell threshold voltage is equal to or higher than the read voltage 422 and lower than a read voltage 423, it is determined that the cell threshold voltage is Level 3. When a cell threshold voltage is equal to or higher than the read voltage 423, it is determined that the cell threshold voltage is Level 4. In general, the read voltages 421 to 423 for classifying the respective levels are set in consideration of the above-described variations. That is, the read voltage 421 is set such that the threshold voltage converges within a range that can be absorbed by a threshold voltage margin to be distinguished from a target threshold voltage even if the threshold voltage varies.

The threshold voltage distribution 401 is a threshold voltage distribution of a cell group into which electrons are injected such that the threshold voltage becomes Level 1. The threshold voltage distribution 402 is a threshold voltage distribution of a cell group into which electrons are injected such that the threshold voltage becomes Level 2. The threshold voltage distribution 403 is a threshold voltage distribution of a cell group into which electrons are injected such that the threshold voltage becomes Level 3. The threshold voltage distribution 404 is a threshold voltage distribution of a cell group into which electrons are injected such that the threshold voltage becomes Level 4.

The graph on the right side of FIG. 5 illustrates a distribution of existence probability of the threshold voltage of the cell after a lapse of a predetermined time from data write. That is, the threshold voltage distribution illustrated in the graph on the right side of FIG. 5 indicates that the threshold voltage distribution indicated by the graph on the left side of FIG. 5 has changed with the lapse of time. In general, the electrons injected into the cell are released from the cell along with the lapse of time. Therefore, for example, the threshold voltage distribution 404 moves in a direction to a lower threshold voltage with the lapse of time, and transitions to a threshold voltage distribution 414. As illustrated in the graph on the right side of FIG. 5, some of cells of the threshold voltage distribution 414 are lower than the read voltage 423 which distinguishes between Level 4 and Level 3 of threshold voltages, and it is determined as Level 3 at the time of reading data of some of the cells.

Since each threshold voltage level such as Level 4 and Level 3 is associated with a bit value as described above, there is a possibility that the bit value at the time of read changes when the threshold voltage changes along with a lapse of time, for example. Accordingly, an error bit occurs. The error bit occurring as a result of electrons flowing out from the cell is corrected as the threshold voltage returns to the original state as electrons are injected into the cell again.

Meanwhile, some of cells of the threshold voltage distribution 402 exceed the read voltage 422 that distinguishes between Level 2 and Level 3 when referring to the graph on the left side of FIG. 5. That is, the graph on the left side of FIG. 5 indicates that there are some cells that have become Level 3 due to excessive injection of electrons although write has been executed intending Level 2. The error bit occurring due to such excessive injection of electrons is hardly corrected by re-injection of electrons and is sometimes corrected to a correct bit value when electrons flow out along with a lapse of time. As described above, the error bit of the FM 320 occurs due to various factors, and there are an error bit that is correctable by re-injection of electrons and an error bit that is uncorrectable.

(1-5) Error Bit Management

When a certain number of error bits have occurred in data held by the FM 320, the NVM module controller 310 of the present embodiment reads the data from the FM 320. Further, the NVM module controller 310 creates expected value data, which is data obtained by correcting the error bit of the data using the ECC, and transmits the expected value data to the FM 320 holding the data in which the error bit has occurred. The FM 320 having received the expected value data writes the expected value data in an area where the data in which the error bit has occurred is stored to correct the error bit occurring in the data. The rewrite process is a process of writing the expected value data in the area where the data in which the error bit has occurred is stored.

Figure 6:
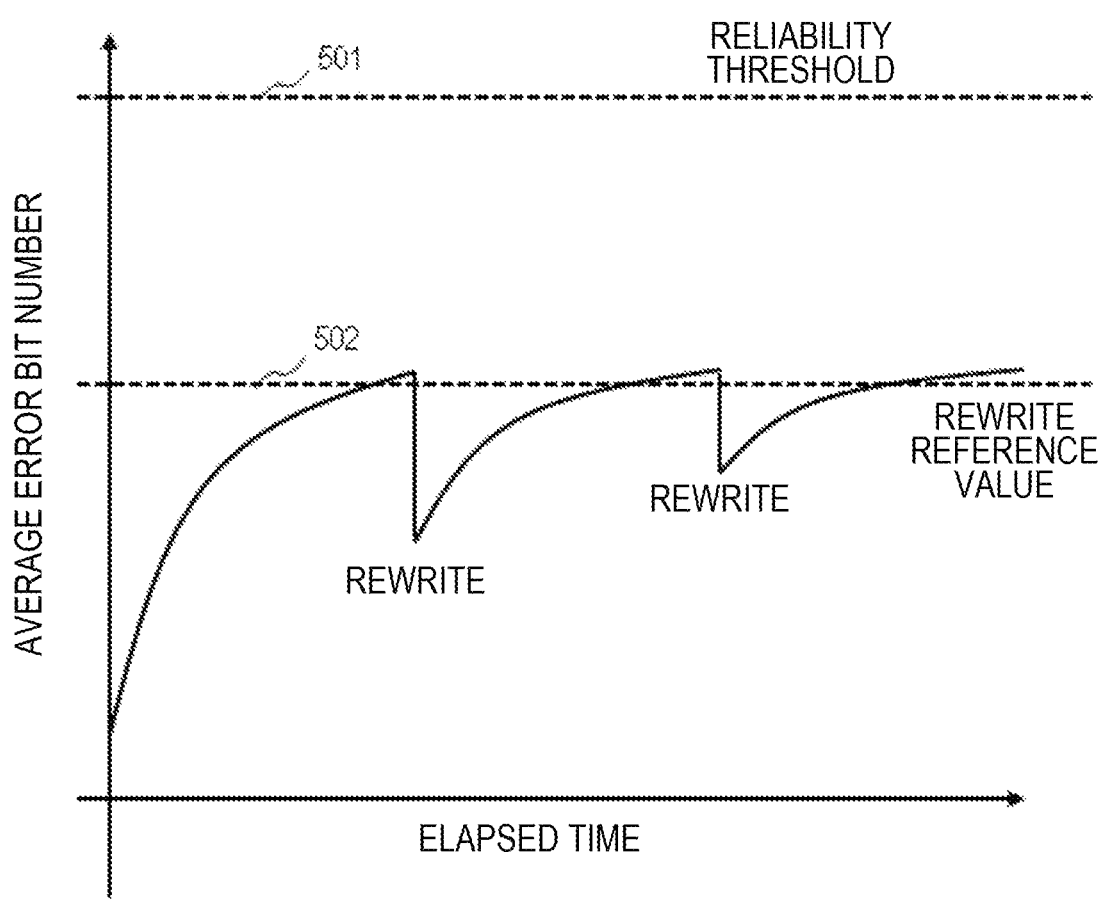
FIG. 6 is a graph illustrating a temporal change in an average error bit number of a data group recorded in a partial storage area of the FM according to the first embodiment.

Error bit management using the rewrite according to the present embodiment will be described with reference to FIG. 6. FIG. 6 is a graph illustrating a temporal change of an average value of the number of error bits (hereinafter also referred to as an average error bit number) per ECC CW of a data group recorded in a partial storage area of the FM 320 of the NVM module 115. In the graph of FIG. 6, the horizontal axis represents an elapsed time since data has been recorded, and the vertical axis represents an average value of the number of error bits occurring in the data. The average error bit number is an example of information indicating the reliability of corresponding data.

In addition, a reliability threshold 501 is described in the graph of FIG. 6, and reliability of a data group is lower than reliability guaranteed by the NVM module 115 when the average number of error bits occurring in the data group exceeds the reliability threshold 501. That is, if the average number of error bits occurring in the data group is equal to or less than the reliability threshold 501, the probability that data correction using the ECC becomes impossible is a certain value or less (for example, $10^{-17}$) in the data group. The NVM module 115 (specifically, for example, the NVM module controller 310) holds the reliability threshold 501, and performs control such that the average error bit number of the data group falls within the reliability threshold 501 or less.

In addition, the NVM module 115 (specifically, for example, the NVM module controller 310) according to the present embodiment holds a rewrite reference value 502. When an average error bit number of a certain data group exceeds the rewrite reference value 502, the NVM module 115 performs rewrite with respect to the data group. Even if the power supply to the NVM module 115 is interrupted for a certain period (for example, three months), the rewrite reference value 502 is desirably set to a value with which the average error bit number of the data group does not exceed the reliability threshold 501. Since the rewrite reference value 502 is set to such a value, the NVM module 115 can cause the average error bit number not to exceed the reliability threshold 501 during a power interruption period even if the power supply to the NVM module 115 is interrupted for a certain period of time so that the rewrite is impossible.

The graph of FIG. 6 illustrates the transition of the average number of error bits occurring in data stored in a certain storage area, and rewrite is performed when the average error bit number increases along with a lapse of time and reaches the rewrite reference value 502 so that the average error bit number decreases. Incidentally, only "error bits correctable by re-injection of electrons" among error bits are corrected by rewrite. In addition, not all the "error bits correctable by re-injection of electrons" are always corrected by rewrite, and some of the "error bits correctable by re-injection of electrons" are uncorrectable by rewrite for some reasons. Thus, the average error bit number does not become zero even if the rewrite is executed as illustrated in FIG. 6.

In addition, the rewrite is executed twice in the example of FIG. 6, but a decrease number of the average error bit number by the second rewrite is smaller than a decrease number of the average error bit number by the first rewrite. Such a situation arises since there is cells in which error bits newly occurs due to erroneous injection of electrons by rewrite (cells in which error bits occurs due to inter-cell interference when electrons are injected into neighboring cells) although the "error bits correctable by re-injection of electrons" are corrected by rewrite. That is, when the rewrite is repeatedly executed, the decrease number of the average error bit number by the rewrite gradually decreases.

Thus, the NVM module 115 of the present embodiment calculates, for example, the number of error bits that are uncorrectable by re-injection of electrons, that is, error bits which are uncorrectable by rewrite, and executes refresh (erases the area once and records new data) when it is determined that the number of error bits uncorrectable by rewrite exceeds a predetermined value.

(1-6) Rewrite Necessity Inspection

Subsequently, the rewrite necessity inspection according to the present embodiment will be described. As described above, the rewrite of the present embodiment is a process of injecting electrons into a cell in order to reduce error bits occurring in written data. In other words, the rewrite is the process aiming at maintaining the reliability of data.

However, when there are few error bits in data, it is unnecessary to immediately execute the rewrite since the reliability of data has not decreased so much. In addition, a cell deteriorates more quickly when the rewrite is performed excessively. Thus, the NVM module 115 of the present embodiment periodically determines whether rewrite is necessary, for example, and executes the rewrite only to a storage area that is determined to require rewrite. Incidentally, the NVM module 115 may execute the rewrite necessity inspection in accordance with an instruction from an external device, for example.

Figure 7:
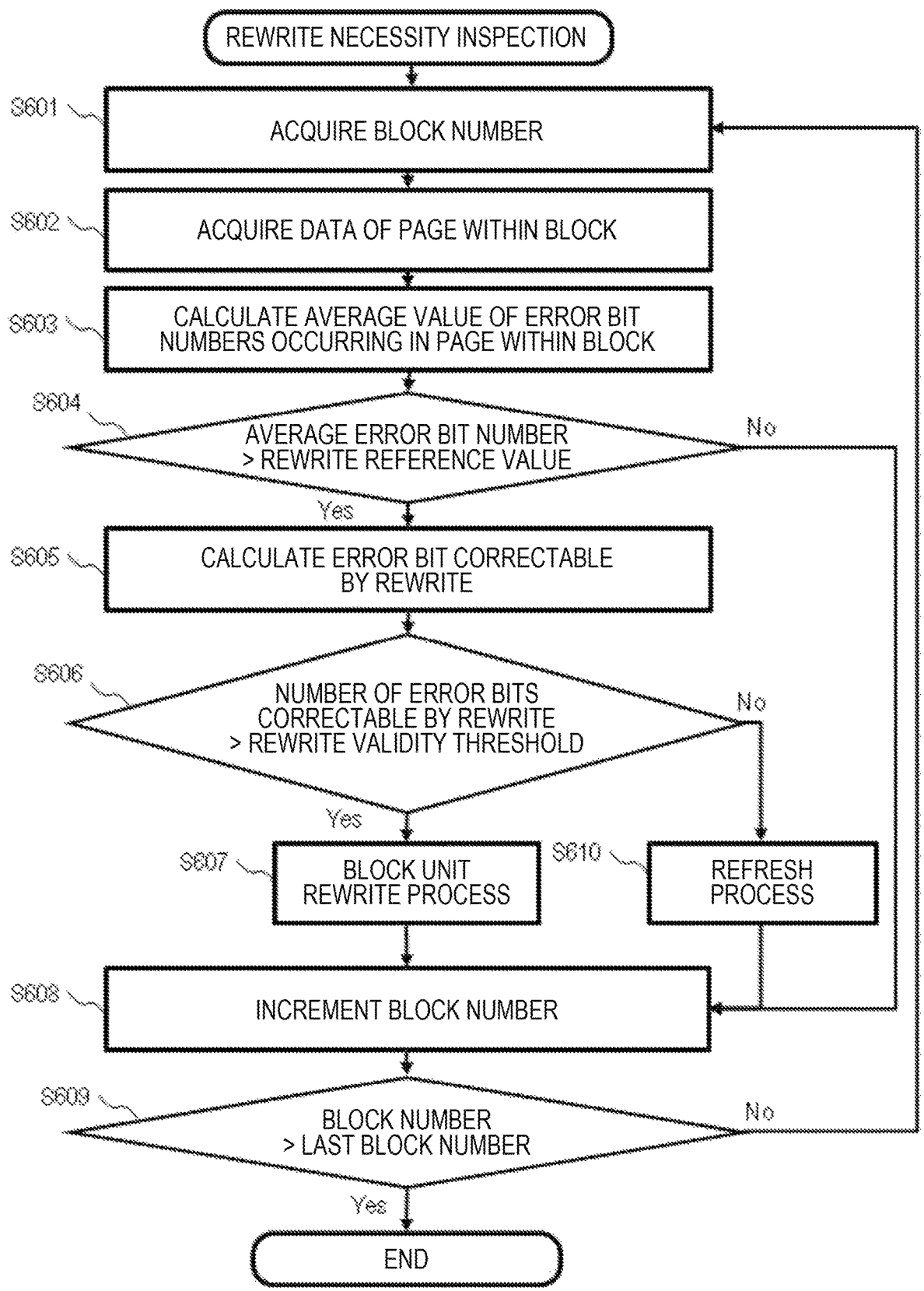
FIG. 7 is a flowchart illustrating an example of a rewrite necessity inspection process according to the first embodiment.

FIG. 7 is a flowchart illustrating an example of a rewrite necessity inspection process of the present embodiment. First, the embedded processor 315 acquires a block number of a rewrite necessity inspection target (S601). The embedded processor 315 acquires 0, which is a block number of a leading block, for example, in the initial step S601. The embedded processor 315 may acquire another block number in the initial step S601. Incidentally, it is desirable for the embedded processor 315 to investigate all storage areas in the FM 320 managed by the NVM module 115 where data has been written during the rewrite necessity inspection.

Subsequently, the embedded processor 315 controls the FM interface 317, and acquires data of the block determined in step S601 and the ECC assigned to the data from the FM 320 (S602). In step S602, the FM interface 317 corrects the acquired data using the acquired ECC, and transfers the corrected data to the data buffer 316. In step S602, the FM interface 317 notifies the embedded processor 315 of the number of error bits found at the time of correction.

Subsequently, the embedded processor 315 calculates the average number of error bits occurring in pages constituting the block acquired in step S602 (S603). Incidentally, the embedded processor 315 may determine whether rewrite is necessary using, for example, information indicating the reliability of data other than the average error bit number such as a mode value and a maximum value of error bits occurring in the pages constituting the block. The embedded processor 315 can stably evaluate the reliability of the data of the block by using the average error bit number for the rewrite necessity inspection.

Subsequently, the embedded processor 315 determines whether the average error bit number calculated in S603 is larger than the rewrite reference value 502 configured to determine whether rewrite is necessary (S604). When determining that the average error bit number is equal to or smaller than the rewrite reference value 502 (S604: No), the embedded processor 315 determines that the rewrite for the block is unnecessary, and the process transitions to step S608 to inspect another block. On the other hand, when determining that the average error bit number is larger than the rewrite reference value 502, the embedded processor 315 transitions to step S605.

Subsequently, the embedded processor 315 calculates the number of error bits correctable by rewrite (S605). Specifically, the embedded processor 315 controls and instructs the FM interface 317 to transfer data before being subjected to correction using the ECC to the data buffer 316. With this control, the expected value data obtained by correcting the error bit using the ECC and the raw data before being subjected to the correction using the ECC are stored in the data buffer 316.

In step S605, the embedded processor 315 uses the expected value data of each paired page to calculate an expected threshold voltage level for each cell as expected value cell data. Similarly, the embedded processor 315 uses the raw data of each paired page to calculate a current threshold voltage for each cell as actual cell data. Then, the embedded processor 315 compares expected value cell data with actual cell data corresponding to the expected value cell data to determine whether the error bit is correctable by rewrite.

Specifically, the embedded processor 315 determines an error bit generated because "a threshold voltage level of the expected value cell data>a threshold voltage level of the actual cell data" as the error bit correctable by rewrite. Then, the embedded processor 315 calculates the total number of error bits correctable by rewrite. On the other hand, the error bit generated because "the threshold voltage level of the expected value cell data<the threshold voltage level of the actual cell data" is the error bit uncorrectable by rewrite. The embedded processor 315 may further calculate the total number of error bits uncorrectable by rewrite.

Subsequently, the embedded processor 315 determines whether the number of error bits determined to be correctable by rewrite in step S605 is larger than a rewrite validity threshold (S606), that is, determines whether rewrite is valid. The rewrite validity threshold is an index to determine the validity concerning error bit correction by rewrite, and is stored in, for example, the NVM module 115 (specifically, for example, the NVM module controller 310).

When the embedded processor 315 determines that the correctable error bit number is equal to or smaller than the rewrite validity threshold (S606: No), refresh is necessary to maintain the reliability of data, and thus, the NVM module 115 performs the refresh with respect to the block (S610), and the process transitions to step S608.

That is, even if the rewrite process is executed on the block in which considerable number of error bits have increased, it is difficult to sufficiently reduce the error bits and thus, the NVM module 115 performs a refresh process in step S610. Incidentally, the NVM module 115 of the present embodiment secures a certain number of blocks for the refresh, and such blocks are called refresh spare blocks. In the refresh process, the embedded processor 315 writes data of a refresh target block to a refresh spare block, and then, erases the data of the refresh target block to secure the block as a new refresh spare block.

On the other hand, when the embedded processor 315 determines that the correctable error bit number exceeds the rewrite validity threshold (S606: Yes), the NVM module 115 executes the rewrite process for the block (S607), and the process transitions to step S608. Incidentally, the embedded processor 315 executes the rewrite process using the expected value data of the paired page with respect to each of all the cell groups of a target block of the rewrite necessity inspection to reduce the error bit of the entire block in step S607. Details of the rewrite process will be described later.

Subsequently, the embedded processor 315 increments a block number to create a block number of the next target block of the rewrite necessity inspection (S608). Subsequently, the embedded processor 315 determines whether the block number created in step S608 is out of the range of the blocks mounted on the NVM module 115 (S609). Specifically, the embedded processor 315 determines whether the block number created in step S608 is larger than a block number of the last block, for example, in step S609.

When determining that the block number created in step S608 is larger than the block number of the last block (S609: Yes), the embedded processor 315 determines that the rewrite necessity inspection has been completed for all the blocks and ends the rewrite necessity inspection. On the other hand, when determining that the block number created in step S608 is equal to or smaller than the block number of the last block (S609: No), the embedded processor 315 transitions to step S601 in order to execute the rewrite necessity inspection on a block having the block number created in step S608.

Incidentally, FIG. 7 illustrates an example in which the rewrite necessity inspection is performed in units of blocks, but it is sufficient for the unit of performing the rewrite necessity inspection (unit of the monitoring target area) to be the unit of a paired page or a unit larger than a paired page. That is, the embedded processor 315 may determine whether rewrite is necessary, for example, in units of paired pages and execute the rewrite process in units of paired pages. However, the refresh process is accompanied by an erase operation, and thus, can be performed only in units of blocks. Therefore, when the embedded processor 315 performs the rewrite in units of paired pages and it is determined in step S606 that refresh is necessary for the corresponding paired page, for example, the entire block including the paired page is subjected to the refresh process.

(1-7) Rewrite Process

Figure 8:
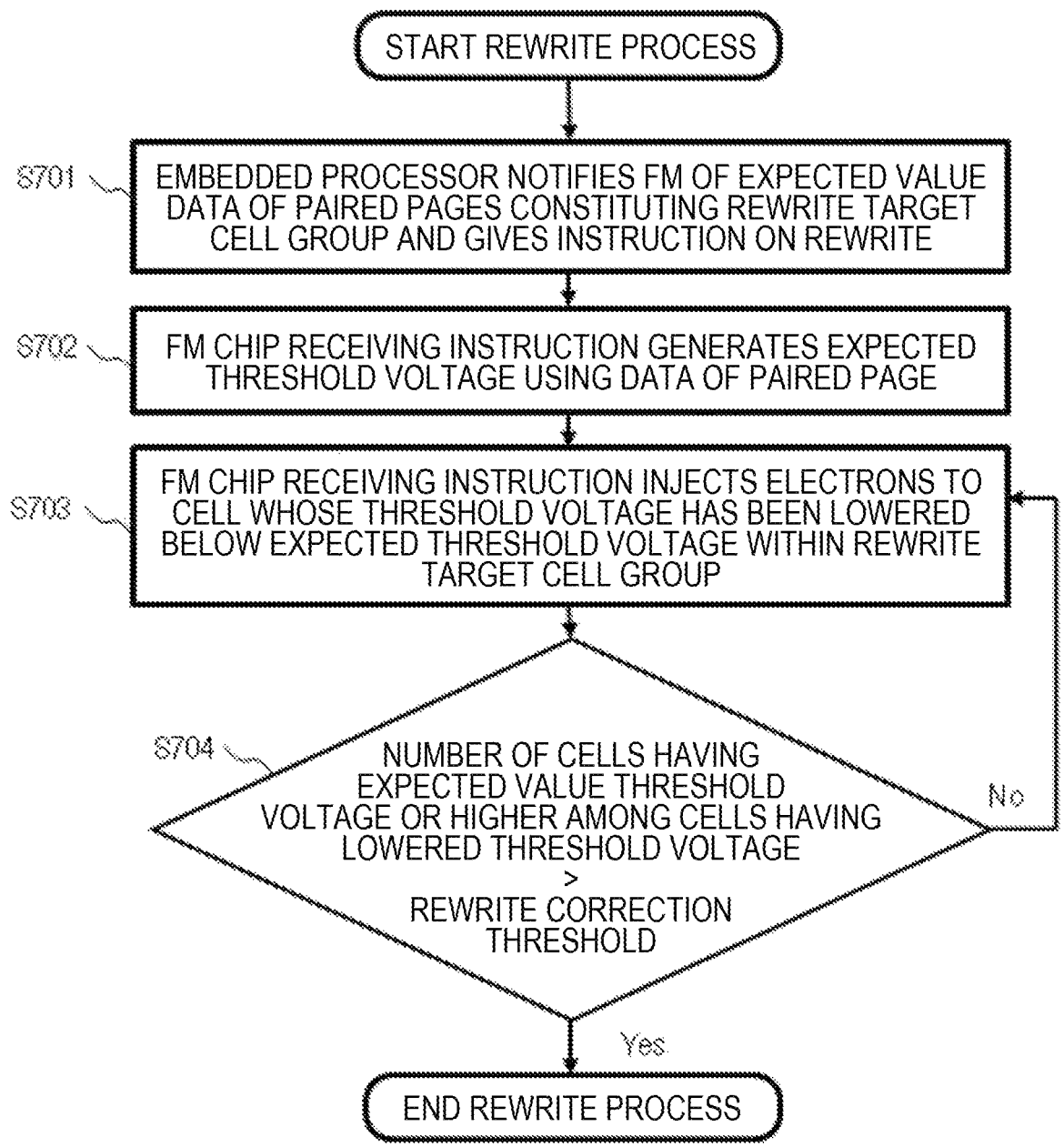
FIG. 8 is a flowchart illustrating an example of a rewrite process according to the first embodiment.

FIG. 8 is a flowchart illustrating an example of the rewrite process (step S607) of the present embodiment. The rewrite process is executed for all the cell groups of the block determined to require rewrite during the rewrite necessity inspection.

First, the embedded processor 315 selects expected value data of a paired page constituting a rewrite target cell group from an expected value data group stored in the data buffer 316 in step S602, transfers the selected data to the FM 320 via the FM interface 317, and instructs the FM 320 for rewrite (S701). The rewrite target cell is a cell that stores the error bit for which "the threshold voltage level of the expected value cell data>the threshold voltage level of the actual cell data".

Incidentally, the NVM module 115 of the present embodiment is equipped with the MLC-type FM 320, the paired page consists of two pages. Therefore, the embedded processor 315 transfers expected value data corresponding to two pages to the FM 320. As described above, the type of the FM 320 mounted on the NVM module 115 may be a type other than the MLC type. For example, if the FM 320 is the TLC type, the paired page consists of three pages, and thus, the embedded processor 315 transfers expected value data corresponding to three pages to the FM 320. In addition, for example, if the FM 320 is of the QLC type, the paired page consists of four pages, and thus, expected value data corresponding to four pages is transferred to the FM 320.

The following steps S702 to 704 are processing performed by the FM 320 receiving the rewrite instruction in step S701. Subsequently, the FM 320 creates an expected value threshold voltage of the rewrite target cell group using the received expected value data (S702).

Subsequently, the FM 320 searches a cell whose threshold voltage is lower than the expected value threshold voltage created in step S702 (that is, the cell corresponding to the error bit correctable by rewrite) from the rewrite target cell group, and injects electrons into the cell (S703). Specifically, for example, the FM 320 injects electrons until reaching the expected value threshold voltage from a state where all threshold voltages of the cell group are in an erasure state.

Subsequently, the FM 320 determines whether the number of cells reaching the expected value threshold voltage or higher is larger than the rewrite correction threshold among cells having lower threshold voltages than the expected value threshold voltage (S704). Incidentally, the rewrite correction threshold is stored in the NVM module 115 (specifically, for example, the NVM module controller 310). The rewrite correction threshold may be the same as a program verification threshold.

When the FM 320 determines that the number of cells reaching the expected value threshold voltage or higher is larger than the rewrite correction threshold among the cells having lower threshold voltages than the expected value threshold voltage (S704: Yes), the rewrite process in the FM 320 ends.

On the other hand, when the FM 320 determines that the number of cells reaching the expected value threshold voltage or higher is equal to or smaller than the rewrite correction threshold among the cells having lower threshold voltages than the expected value threshold voltage (S704: No), the FM 320 transitions to step S703 in order to execute the electron injection again.

In the present embodiment, the example in which the rewrite process is performed in the unit the block, that is, the example in which rewrite process is performed with respect to all the cell groups constituting the block has been described, but the unit of performing the rewrite process is not limited to the unit of the block. For example, when the rewrite necessity inspection in FIG. 7 is executed in units of paired pages, the rewrite process illustrated in FIG. 8 is performed with respect to cell groups constituting a paired page.

As described above, the NVM module 115 according to the present embodiment appropriately performs the rewrite process on the block in which the error bits have increased.

As a result, the NVM module 115 of the present embodiment can reduce the error bits while lowering the frequency of refresh. A degree of deterioration of the FM 320 caused by the rewrite process of re-injecting electrons into a cell is smaller than a degree of deterioration of the FM 320 caused by the refresh process accompanied by erasure of a block. Therefore, the NVM module 115 of the present embodiment can maintain the reliability of data held by the FM 320 while achieving a long life of the FM 320.

Second Embodiment

In a second embodiment, a case where the NVM module 115 determines that there is an area where error bit correction using an ECC is impossible during rewrite necessity inspection will be described. The NVM module 115 of the second embodiment notifies a host device (for example, the controller 117 in FIG. 1 or the processor 212 in FIG. 2) of the area for which it is determined that data correction using the ECC is impossible. Then, the host device having received the notification restores data using a data correction mechanism such as RAID, and transmits restored data to the NVM module 115 or gives an instruction of rewrite. The NVM module 115 performs a rewrite process using the restored data as expected value data. Hereinafter, differences from the first embodiment will be described.

(2-1) Rewrite Necessity Inspection

Figure 9:
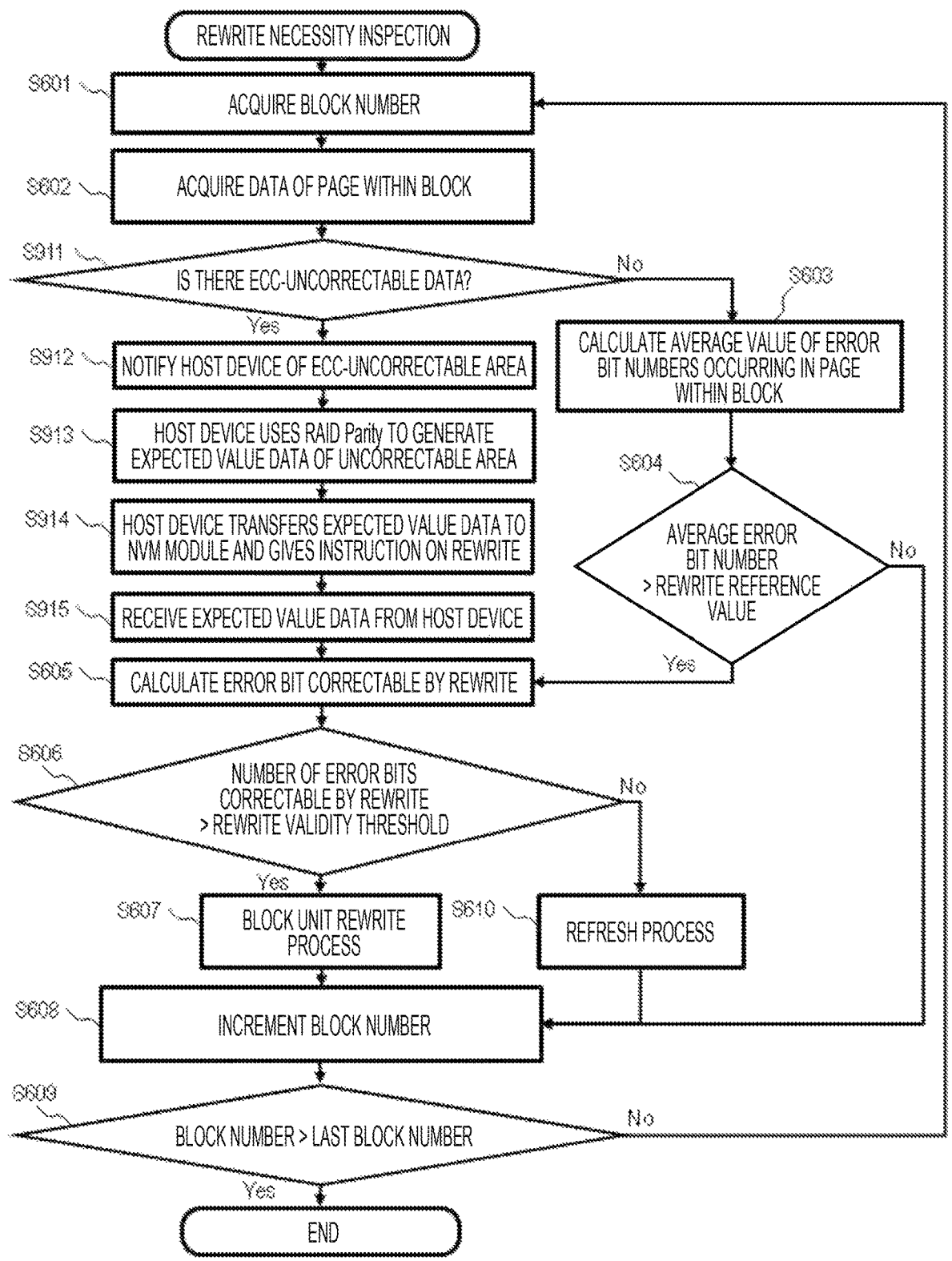
FIG. 9 is a flowchart illustrating an example of a rewrite necessity inspection process according to a second embodiment.

FIG. 9 is a flowchart illustrating an example of a rewrite necessity inspection process of the present embodiment. The processing in step S602 in FIG. 9 is the same as the processing in step S602 in FIG. 7, but is different in terms that the FM interface 317 notifies the embedded processor 315 that there is uncorrectable data when there is the data that is not correctable using the ECC and that the process proceeds to step S911 after step S602.

Subsequently, the embedded processor 315 determines whether the notification indicating that there is the data uncorrectable using the ECC has been received (S911). If the embedded processor 315 has not received the notification that there is the data uncorrectable using the ECC (S911: No), the process transitions to step S603 similarly to FIG. 6 since the expected value threshold voltage can be created only by the NVM module 115. Incidentally, when the embedded processor 315 has not received the notification that there is the data uncorrectable using the ECC has not been received (S911: No), the process may transition to step S605 without going through steps S603 and S604.

On the other hand, when having received the notification indicating that there is the data uncorrectable using the ECC (S911: Yes), the embedded processor 315 notifies the host device (for example, the controller 117 in FIG. 1 or the processor 212 in FIG. 2) of the area (for example, ECC CW) that is uncorrectable using the ECC (S912). Specifically, the embedded processor 315, for example, manages a logical space to be provided to the host device and a physical space that is a storage area of the FM 320 in association with each other, acquires a logical area associated with a physical area where data correction using the ECC is impossible, and notifies the host device of the acquired logical area.

Subsequently, the host device restores the data that is uncorrectable with the ECC using a data redundancy mechanism managed by the host device, and creates expected value data for rewrite (S913). More specifically, a storage system, for example, stores data in a plurality of the NVM modules 115 using a data correction mechanism such as RAID or erasure coding, and can restore lost data even if data of one of the NVM modules 115 is lost by using data of the other NVM module 115.

Subsequently, the host device transfers the expected value data generated in step S913 to the NVM module 115 and gives an instruction of rewrite (S914). Specifically, the host device notifies the NVM module 115 of, for example, the logical area, which is associated with the physical area for which data correction using the ECC is impossible acquired from the NVM module 115 in step S912, and gives an instruction of rewrite.

Subsequently, the NVM module 115 acquires the expected value data from the host device (S915). At this time, the embedded processor 315 creates an expected value data group of a rewrite necessity inspection target block using the expected value data acquired from the host device and another expected value data corrected with the ECC in step S602 of the rewrite necessity inspection target block, and the process transitions to step S605.

The rewrite necessity inspection according to the second embodiment has been described as above. The NVM module 115 of the present embodiment can obtain the expected value data and perform rewrite by requesting data correction to the host device, for example, even from the data for which the error bit correction using the ECC is impossible.

Third Embodiment (3-1) Rewrite Necessity Inspection

As described above, the NVM module 115 of the first embodiment and the second embodiment calculates the number of "error bits correctable by re-injection of electrons" which are error bits correctable by rewrite, and determines the necessity of rewrite based on the calculated number. In addition, when "error bits uncorrectable by re-injection of electrons" increase, the NVM module 115 of the first embodiment and the second embodiment performs the refresh of erasing a target block and transferring the error bits to another block.

The "error bit uncorrectable by re-injection of electrons" is an error bit generated as electrons are injected into a cell beyond an expected value, and is uncorrectable by rewrite. However, the FM 320 executes weak erase on a block including the error bit, and thus, can take excessive electrons out of the cell, and further, correct the error bit. The weak erase is an erase operation that satisfies at least one of a smaller number of pulses to be applied to a cell, a shorter pulse application time, and a smaller voltage as compared with normal erase. That is, an erase voltage pulse, which satisfies at least one of a predetermined time or shorter, a predetermined number or smaller, and a predetermined voltage or lower, is applied to a weak erase process target block in a weak erase process. A degree of deterioration of the FM 320 caused by the weak erase is smaller than a degree of deterioration of the FM 320 caused by the normal erase, that is, is smaller than a degree of deterioration of the FM 320 caused by refresh.

The NVM module 115 according to the third embodiment reduces error bits correctable by the weak erase to a certain number or smaller with respect to the block in which the number of error bits is equal to or larger than the certain number, and then, injects electrons again by rewrite. Differences from the first embodiment will be described below.

Figure 10:
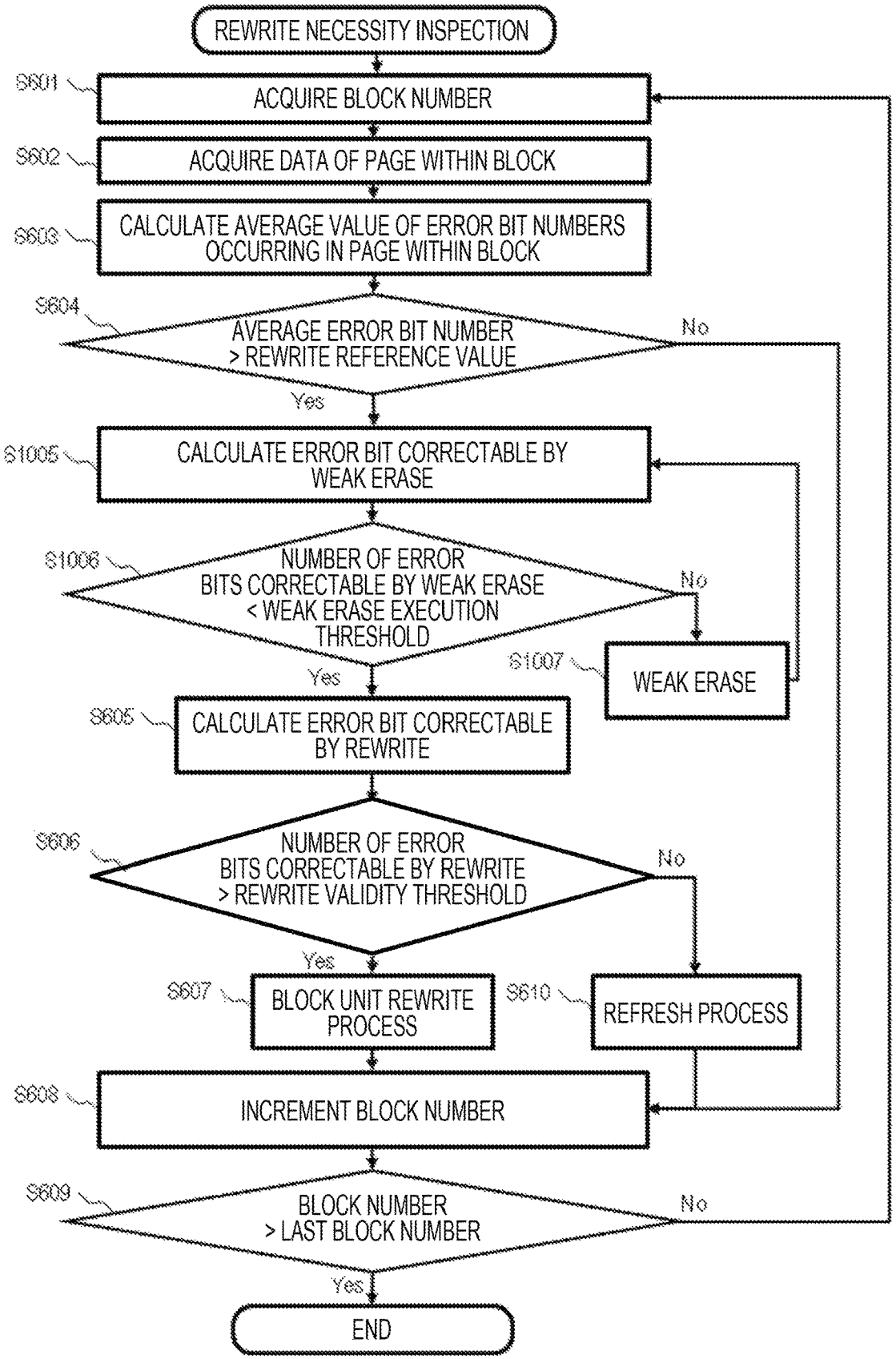
FIG. 10 is a flowchart illustrating an example of a rewrite necessity inspection process according to a third embodiment.

FIG. 10 is a flowchart illustrating an example of a rewrite necessity inspection process of the third embodiment. The process transitions from step S604 to step S1005. The embedded processor 315 calculates the number of error bits correctable by the weak erase (S1005). Step S1005 is the same processing as step S605, but is different in terms that a bit generated because "a threshold voltage level of expected value cell data<a threshold voltage level of actual cell data" is determined an error bit correctable by weak erase, and error bits correctable by the weak erase is calculated instead of calculating the total number of error bits correctable by rewrite. Incidentally, the embedded processor 315 may further calculate the number of error bits correctable by rewrite in step S1005. In this case, the processing of step S605 is unnecessary.

Subsequently, the embedded processor 315 determines whether to perform the weak erase (S1006). The NVM module 115 (specifically, for example, the NVM module controller 310) holds a weak erase execution threshold which is a reference value of the number of error bits for which the weak erase needs to be performed. Specifically, for example, the embedded processor 315 determines whether the number of error bits correctable by the weak erase is smaller than the weak erase execution threshold in step S1006.

When determining that the number of error bits correctable by weak erase is smaller than the weak erase execution threshold (S609: Yes), the embedded processor 315 transitions to step S605. On the other hand, when determining that the number of error bits correctable by the weak erase is equal to or larger than the weak erase execution threshold (S609: No), the embedded processor 315 transitions to step S1007 in order to perform the weak erase.

Subsequently, the FM 320 performs the weak erase on a rewrite necessity inspection target block (S1007), and the process transitions to step S1005. More specifically, the embedded processor 315 controls the FM interface 317, for example, to transfer a weak erase command including number information of a weak erase target block to the FM 320 in step S1007, and the FM 320 having received the command performs the weak erase on the designated block.

Incidentally, FIG. 10 illustrates an example in which the rewrite process is performed after the weak erase process, but the weak erase process may be performed after the rewrite process. However, the weak erase process is performed on the entire block, that is, performed even to a cell holding correct data. When electrons are taken out of the cell holding correct data, there is a risk that data of the cell may change to an error bit correctable by rewrite. Therefore, it is desirable that the rewrite process be performed after the weak erase process as illustrated in FIG. 10.

The NVM module 115 of the present embodiment appropriately performs not only the rewrite process but also the weak erase process with respect to the block in which the error bits have increased, thereby correcting an error that is uncorrectable by the rewrite process. As a result, the NVM module 115 of the present embodiment can reduce the error bits while further lowering the frequency of refresh. As a result, the NVM module 115 of the present embodiment can maintain the reliability of data held by the FM 320 while achieving a longer life of the FM 320.

Further, the NVM module 115 of the present embodiment can correct the error bit of the cell into which electrons have been excessively injected with the weak erase, and thus, does not necessarily perform the refresh process. More specifically, for example, the embedded processor 315 may transition from step S605 to step S607, that is, the processing of step S606 and step S610 is not necessarily executed. In addition, for example, when determining that the number of correctable error bits is equal to or smaller than the rewrite validity threshold (S606: No), the embedded processor 315 may transition to step S608 without executing the processing of step S607.

Fourth Embodiment

(4-1) Rewrite Necessity Inspection

The NVM module 115 of the first to third embodiments reads data from the FM 320 and determines whether rewrite or refresh is necessary based on the number of error bits occurring in the data. The NVM module 115 of a fourth embodiment determines whether rewrite is necessary based on an elapsed time from write or rewrite of data and a temperature of the FM 320 during the elapsed time.

As the elapsed time since data has been written in a block of FM 320 becomes longer, the number of error bits in the block increases. As the temperature of the FM 320 becomes higher, the number of error bits in the block increases. Therefore, the elapsed time and the temperature of the FM 320 are information indicating the error bit in the block, that is, information indicating reliability of data stored in the block.

The NVM module 115 of the present embodiment further includes, for example, a sensor configured to measure the temperature of the FM 320, and holds, for example, history of the temperature of the FM 320 on the basis of a predetermined period (for example, daily basis). Incidentally, the NVM module 115 does not necessarily measure the temperature of each of the FMs 320, and the temperature measured by one sensor mounted on the NVM module 115 may be used as the temperature of all the FMs 320 in the NVM module 115. In addition, the NVM module 115 acquires a write time with respect to the last page of a block from a clock such as a real time clock (RTC) held by itself or held by an external device (for example, the host device or the like) connected to the NVM module 115, and holds the acquired write time as a time stamp.

Figure 11:
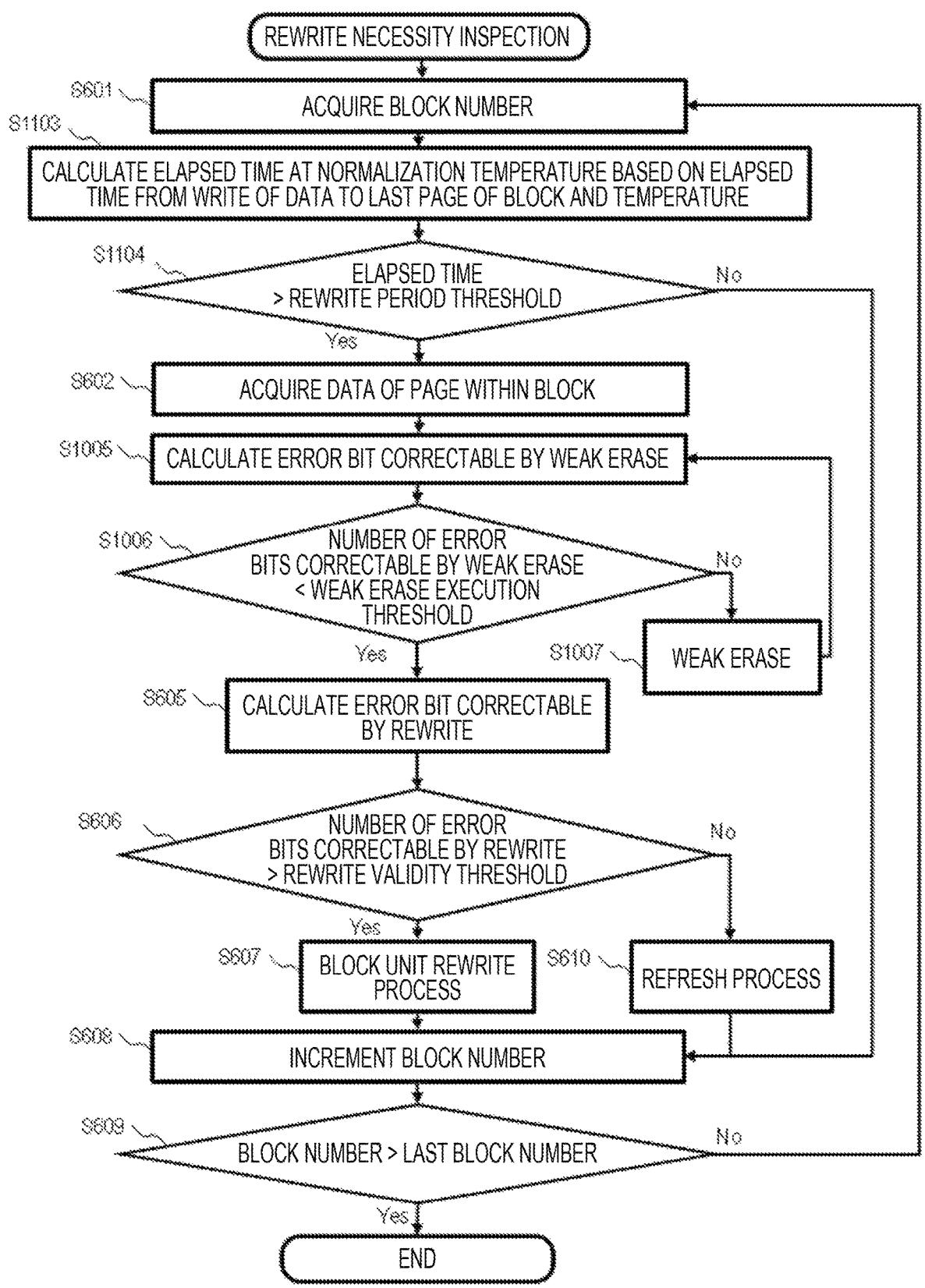
FIG. 11 is a flowchart illustrating an example of a rewrite necessity inspection process according to a fourth embodiment.

Differences from the third embodiment of the present embodiment will be described. FIG. 11 is a flowchart illustrating an example of a rewrite necessity inspection process of the fourth embodiment. One of features of the flowchart of FIG. 11 is that the processing of step S602 of acquiring data of a page within a block is performed after processing of step S1104 which is an example of a rewrite necessity determination process.

Subsequently to the processing of step S601, the embedded processor 315 transitions to step S1103. The embedded processor 315 calculates an elapsed time at a predetermined normalization temperature from the elapsed time since the data of the block has been written (step S1103). Although an example in which the normalization temperature is 50° C. will be described in the present embodiment, the normalization temperature is not limited to 50° C. Details of the processing in step S1103 will be described below.

The embedded processor 315 acquires a write time to the last page of the block and temperature information up to a current time from the write time to the last page. The embedded processor 315 calculates an elapsed time which is a difference between the write time to the last page and a determination target time (in the present embodiment, it is the current time). In addition, the embedded processor 315 averages the temperatures indicated by the acquired temperature information and calculates an average temperature during the elapsed time. The embedded processor 315 calculates the elapsed time at 50° C., which is the normalization temperature of the NVM module 115, using the elapsed time and the average temperature.

The embedded processor 315 calculates the elapsed time at the normalization temperature using, for example, the Arrhenius equation. Specifically, for example, when the elapsed time is 500 hours and the average temperature is 60° C., the elapsed time at the normalization temperature of 50° C. is calculated as "$\exp((1.1 \text{ [eV]}/8.61\times10^{-5})\times(1/(273+50° \text{C.})-1/(273+60° \text{C.}))\times500$ hours" ([eV] in the above formula is an energy unit (electron volt)). That is, the elapsed time of 500 hours at the average temperature of 60° C. is handled as equivalent to 1640 hours at the normalization temperature of 50° C. In other words, the reliability of data stored in the FM 320 when the temperature of the FM 320 is 60° C. for 500 hours is handled to be equivalent to the reliability of data when the temperature of the FM 320 is 50° C. for 1640 hours.

Incidentally, the embedded processor 315 may calculate an elapsed time since data write at the normalization temperature using an algorithm other than the Arrhenius equation. For example, the NVM module 115 holds magnifications corresponding to the respective temperatures in advance, for example. Then, the embedded processor 315 may calculate a value, obtained by multiplying a magnification corresponding to a calculated average temperature to an elapsed time calculated as a difference between the write time with respect to the last page and the current time, as the elapsed time at the normalization temperature.

Subsequently, the embedded processor 315 determines whether the elapsed time at the normalization temperature exceeds a predetermined rewrite period reference value (S1104). The NVM module 115 (specifically, for example, the NVM module controller 310) according to the present embodiment holds the rewrite period reference value in advance. When determining that the elapsed time at the normalization temperature exceeds the rewrite period reference value (S1103: Yes), the embedded processor 315 determines that the rewrite process for the block is necessary and transitions to step S602. On the other hand, when determining that the elapsed time at the normalization temperature is equal to or shorter than the rewrite period reference value (S1103: No), the embedded processor 315 determines that the rewrite process is unnecessary at the moment and transitions to step S608.

Incidentally, the example in which the processing relating to the weak erase in steps S1005 to S1007 is performed after the processing of step S602 is described in FIG. 11, but the processing of steps S1005 to S1007 is not necessarily performed. That is, the processing of step S605 may be performed after the processing of step S602.

In addition, the elapsed time at the normalization temperature is calculated in step S602, but the embedded processor 315 does not necessarily take the temperature into account. Specifically, for example, the embedded processor 315 may calculate an elapsed time since data has been written to the last page in step S1103 and compare the elapsed time with a rewrite period threshold in step S1104.

In addition, the embedded processor 315 may compare, for example, an average temperature during the elapsed time since the data has been written to the last page with the rewrite period threshold in step S1104.

The NVM module 115 of the present embodiment estimates the reliability of the data stored in the block based on the elapsed time since the data has been written to the block and the temperature of the FM 320 during the elapsed time, and determines whether rewrite is necessary depending on the reliability. The NVM module 115 of the present embodiment can perform the rewrite necessity inspection at high speed since it is not always necessary to acquire data of a determination target block in the rewrite necessity inspection (when it is determined as No in step S1104).

Incidentally, the present invention is not limited to the above-described embodiments and includes various modifications. For example, the above-described embodiments have been described in detail in order to describe the present invention in an easily understandable manner, and are not necessarily limited to those including the entire configuration that has been described above. In addition, some configurations of a certain embodiment can be substituted by configurations of another embodiment, and further, a configuration of another embodiment can be also added to a configuration of a certain embodiment. In addition, addition, deletion, or substitution of other configurations can be made with respect to some configurations of each embodiment.

In addition, a part or all of each of the above-described configurations, functions, processing units, processing means, and the like may be realized, for example, by hardware by designing with an integrated circuit and the like. In addition, each of the above-described configurations, functions, and the like may also be realized by software by causing a processor to interpret and execute a program for realizing each of the functions. Information such as programs, tables, and files that realize the respective functions can be installed in a recording device such as a memory, a hard disk, and a solid state drive (SSD), or a recording medium such as an IC card, an SD card, and a DVD.

In addition, only control lines and information lines considered to be necessary for the description have been illustrated, and all of the control lines and information lines required as a product are not necessarily illustrated. It may be considered that most of configurations are practically connected to each other.

The invention claimed is:

1. A flash memory module comprising: a flash memory; and a controller which controls read and write of data from and to the flash memory,
wherein the controller
acquires information indicating reliability of monitoring target data in a monitoring target area of the flash memory,
specifies a first cell among cells in which error bits have occurred in the monitoring target data when it is determined that the reliability indicated by the acquired information is lower than a predetermined reliability threshold, the first cell is a cell having a threshold voltage level lower than a threshold voltage level of a corresponding cell in expected value data obtained by correcting an error bit of the monitoring target data,
transmits rewrite correction target cell data to the flash memory, the rewrite correction target cell data is data corresponding to data of the specified first cell in the expected value data,
the flash memory injects an electron into the specified first cell based on a threshold voltage indicated by the rewrite correction target cell data,
notifies the flash memory of a block including the monitoring target area when it is determined that the reliability indicated by the acquired information is lower than the predetermined reliability threshold and a number of error bits in a second cell is determined to be equal to or larger than a second predetermined number of error bits, the second cell is a cell having a threshold voltage level higher than a threshold voltage level of a corresponding cell in expected value data among the cells in which the error bits have occurred, and
the flash memory applies an erase voltage pulse to the block, the erase voltage pulse satisfying at least one of a predetermined pulse application time or shorter, a predetermined number of pulses or smaller, and a predetermined voltage pulse amplitude or lower.

2. The flash memory module according to claim 1, wherein the controller transmits the rewrite correction target cell data to the flash memory when it is determined that the reliability indicated by the acquired information is lower than the predetermined reliability threshold and a number of error bits in the first cell is larger than a first predetermined number of error bits.

3. The flash memory module according to claim 2, wherein the controller transmits an instruction to perform a refresh process on a block including the monitoring target area to the flash memory when it is determined that the reliability indicated by the acquired information is lower than the predetermined reliability threshold and the number of error bits in the first cell is equal to or smaller than the first predetermined number of error bits, and
the flash memory performs the refresh process on the block according to the instruction.

4. The flash memory module according to claim 1 which is connected to a host device that holds the expected value data,
wherein the flash memory
holds an ECC assigned to the monitoring target data,
generates the expected value data based on the ECC and transmits the generated expected value data to the controller when the monitoring target data does not include a bit uncorrectable based on the ECC, and
transmits a notification indicating that the monitoring target data includes the uncorrectable bit to the controller when the monitoring target data includes the bit uncorrectable based on the ECC,
the controller
notifies the host device of a logical area including the uncorrectable bit,
acquires the expected value data from the host device,
specifies the first cell from the logical area, and
transmits the rewrite correction target cell data to the flash memory, and
the flash memory injects the electron into the first cell based on the threshold voltage indicated by the rewrite correction target cell data.

5. The flash memory module according to claim 1, wherein the controller transmits the rewrite correction target cell data to the flash memory when it is determined that the reliability indicated by the acquired information is lower than the predetermined reliability threshold, it is determined that the number of error bits in the second cell is smaller than the second predetermined number of error bits, and it is determined that the number of error bits in the first cell is larger than a first predetermined number of error bits.

6. The flash memory module according to claim 1, wherein the controller
holds an elapsed time from a last write time with respect to the monitoring target area to a determination target time and temperature history of the flash memory during the elapsed time, acquires the elapsed time and the temperature history as the information indicating the reliability, calculates an average temperature of the flash memory during the elapsed time based on the temperature history, sets a first time such that reliability of data stored in the flash memory when the first time has elapsed with a temperature of the flash memory at a predetermined temperature is equal to reliability of data stored in the flash memory when the elapsed time has elapsed with the temperature of the flash memory at the average temperature, and determines that the reliability indicated by the acquired information is lower than the predetermined reliability threshold when the first time is longer than a third predetermined number of error bits.

7. A storage system comprising:

a flash memory module including a first flash memory and a controller which controls read and write of data from and to the first flash memory; and a host device which is connected to the flash memory module and controls the flash memory module, wherein the controller acquires information indicating reliability of monitoring target data in a monitoring target area of the flash memory, specifies a first cell among cells in which error bits have occurred in the monitoring target data when it is determined that the reliability indicated by the acquired information is lower than a predetermined reliability threshold, the first cell is a cell having a threshold voltage level lower than a threshold voltage level of a corresponding cell in expected value data obtained by correcting an error bit of the monitoring target data, transmits rewrite correction target cell data to the flash memory, the rewrite correction target cell data is data corresponding to data of the specified first cell in the expected value data, the flash memory injects an electron into the specified first cell based on a threshold voltage indicated by the rewrite correction target cell data, notifies the flash memory of a block including the monitoring target area when it is determined that the reliability indicated by the acquired information is lower than the predetermined reliability threshold and a number of error bits in a second cell is determined to be equal to or larger than a second predetermined number of error bits, the second cell is a cell having a threshold voltage level higher than a threshold voltage level of a corresponding cell in expected value data among the cells in which the error bits have occurred, and the flash memory applies a erase voltage pulse to the block, the erase voltage pulse satisfying at least one of a predetermined pulse application time or shorter, a predetermined number of pulses or smaller, and a predetermined voltage pulse amplitude or lower.

8. The storage system according to claim 7 further comprising a second flash memory which holds redundant data configured to restore the monitoring target data and is connected to the host device, wherein the first flash memory holds an ECC assigned to the monitoring target data, generates the expected value data based on the ECC and transmits the generated expected value data to the controller when the monitoring target data does not include a bit uncorrectable based on the ECC, and transmits a notification indicating that the monitoring target data includes the uncorrectable bit to the controller when the monitoring target data includes the bit uncorrectable based on the ECC, the controller notifies the host device of a logical area including the uncorrectable bit, the host device acquires the redundant data from the second flash memory, generates the expected value data using the redundant data, and transmits the generated expected value data to the controller, the controller specifies the first cell from the logical area, and transmits the rewrite correction target cell data to the first flash memory, and the first flash memory injects the electron into the first cell based on the threshold voltage indicated by the rewrite correction target cell data.

9. A method of controlling a flash memory by a flash memory module, the flash memory module including the flash memory and a controller which controls read and write of data from and to the flash memory, the method comprising:

acquiring information indicating reliability of monitoring target data in a monitoring target area of the flash memory by the controller;

specifying a first cell among cells in which error bits have occurred in the monitoring target data when it is determined that the reliability indicated by the acquired information is lower than a predetermined reliability threshold, the first cell is a cell having a threshold voltage level lower than a threshold voltage level of a corresponding cell in expected value data obtained by correcting an error bit of the monitoring target data;

transmitting rewrite correction target cell data to the flash memory, the rewrite correction target cell data is data corresponding to data of the specified first cell in the expected value data;

injecting an electron into the specified first cell based on a threshold voltage indicated by the rewrite correction target cell data by the flash memory;

notifying the flash memory of a block including the monitoring target area when it is determined that the reliability indicated by the acquired information is lower than the predetermined reliability threshold and a number of error bits in a second cell is determined to be equal to or larger than a second predetermined number of error bits, the second cell is a cell having a threshold voltage level higher than a threshold voltage level of a corresponding cell in expected value data among the cells in which the error bits have occurred; and applying an erase voltage pulse to the block by the flash memory, the erase voltage pulse satisfying at least one of a predetermined pulse application time or shorter, a predetermined number of pulses or smaller, and a predetermined voltage pulse amplitude or lower.

* * * * *